United States Patent
Shoji et al.

(10) Patent No.: US 7,682,706 B2
(45) Date of Patent: Mar. 23, 2010

(54) PRECOATED METAL SHEET WITH LITTLE AFFECT ON ENVIRONMENT

(75) Inventors: Hiromasa Shoji, Futtsu (JP); Koki Tanaka, Futtsu (JP); Hiromasa Nomura, Futtsu (JP); Yuji Kubo, Futtsu (JP); Takeshi Hamada, Futtsu (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 10/581,828

(22) PCT Filed: Dec. 2, 2004

(86) PCT No.: PCT/JP2004/018340

§ 371 (c)(1),
(2), (4) Date: Jul. 31, 2006

(87) PCT Pub. No.: WO2005/053948

PCT Pub. Date: Jun. 16, 2005

(65) Prior Publication Data

US 2007/0141382 A1 Jun. 21, 2007

(30) Foreign Application Priority Data

Dec. 3, 2003 (JP) .............................. 2003-404590

(51) Int. Cl.
*B32B 9/00* (2006.01)
(52) U.S. Cl. ................. 428/624; 428/626; 428/632; 428/633; 428/652; 428/469; 428/472

(58) Field of Classification Search .............. 428/624, 428/626, 632, 633, 650, 652, 653, 658, 659, 428/681, 684, 685, 614, 215, 216, 332, 336, 428/457, 469, 471, 472, 701, 472.1, 472.2, 428/472.3, 702
See application file for complete search history.

(56) References Cited

U.S. PATENT DOCUMENTS

| 3,899,624 A | 8/1975 | Sutherland |
| 6,730,414 B2 * | 5/2004 | Yamamoto et al. .......... 428/653 |
| 2003/0072962 A1 * | 4/2003 | Matsuzaki et al. .......... 428/623 |

FOREIGN PATENT DOCUMENTS

| EP | 1 405 933 | * | 4/2004 |
| JP | 2-207411 A | | 8/1990 |
| JP | 04032577 A | | 2/1992 |
| JP | 5-230666 A | | 9/1993 |
| JP | 8-276533 A | | 10/1996 |
| JP | 11-029724 A | | 2/1999 |
| JP | 2001348678 A | | 12/2001 |
| JP | 2002-53979 A | | 2/2002 |
| JP | 2003-201578 A | | 7/2003 |
| JP | 2006-525134 | | 11/2006 |
| WO | WO 02/103080 | * | 2/2002 |
| WO | WO 2004/098795 | | 11/2004 |

* cited by examiner

*Primary Examiner*—Timothy M Speer
(74) *Attorney, Agent, or Firm*—Kenyon & Kenyon LLP

(57) ABSTRACT

The present invention provides a precoated metal sheet excellent in the coating material adhesion and having little affect on environment. The precoated metal sheet of the invention is a precoated metal sheet comprising a metal or plated metal sheet having stacked on the surface thereof at least a coat layer and an organic resin layer, the metal or plated metal sheet mainly comprising zinc and aluminum and the coat layer mainly comprising one or both of a metal oxide and a metal hydroxide each using a metal species exclusive of chromium.

7 Claims, No Drawings

PRECOATED METAL SHEET WITH LITTLE AFFECT ON ENVIRONMENT

TECHNICAL FIELD

The present invention relates to a precoated metal sheet using, as the substrate, a metal or plated metal sheet mainly comprising zinc and aluminum. More specifically, the present invention relates to a precoated metal sheet excellent in the coating material adhesion, friendly to the global environment by virtue of not containing hexavalent chromium, which is considered to have a large affect on environment, and suitable for use in automobiles, building materials and home appliances.

BACKGROUND ART

Many of the metal sheets used for home appliances, building materials and automobiles are precoated for the purpose of enhancing the design properties and corrosion resistance. For such a metal sheet, a chemical conversion treatment, called a chromate treatment, is applied as a pretreatment to coating in many cases, because the chromate-treated film exhibits excellent corrosion resistance owing to the self-repairing function of hexavalent chromium contained in the film and excellent coating material adhesion owing to the hydrous oxide containing hexavalent chromium.

However, with recent increase in the concern for the global environment, it is required to suppress the elution of hexavalent chromium and, if possible, not to use the chromate treatment.

Against such a background, a technique called resin chromate obtained by compounding an organic resin and chromate has been reported in JP 5-230666 A. By this technique, the elution of hexavalent chromium can be decreased but cannot be completely prevented.

On the other hand, various chromate-free treatments having a performance comparable to the chromate treatment have been recently developed. A representative example thereof is a technique of covering the metal surface with an organic resin having a chelate-forming ability to intensify the bonding force between the cover film and the metal surface. For example, JP 11-29724 A discloses a chromate-free treatment using an aqueous resin containing a thiocarbonyl group-containing compound and a phosphate ion and further containing a water-dispersible silica. However, the coating material adhesion is not necessarily satisfied in uses where severe working is applied.

As described above, a chromate-free treatment with a coating material adhesion at a high level has not been developed and its urgent development is being demanded.

DISCLOSURE OF THE INVENTION

Under these circumstances, the present invention has been made and an object of the present invention is to provide a precoated metal sheet excellent in coating material adhesion, free from hexavalent chromium and having little affect on environment.

As a result of intensive investigations to solve the above-described problems, the present inventors have found that when having, on at least one surface of a metal or plated metal sheet mainly comprising zinc and aluminum, a coat layer mainly comprising one or both of a metal oxide and a metal hydroxide each using a metal species exclusive of chromium, a precoated metal sheet exhibits coating material adhesion equal to that of a chromate treated metal sheet and furthermore, that when the coverage of the cover layer is from 50 to less than 100%, the coating material adhesion is equal to or greater than that of the chromate treated metal sheet. The present invention has been accomplished based on these findings.

That is, the gist of the present invention is as follows.

(1) A precoated metal sheet comprising a metal or plated metal sheet having stacked on at least one surface thereof at least a coat layer and an organic resin layer, the metal or plated metal sheet mainly comprising zinc and aluminum and the coat layer mainly comprising one or both of a metal oxide and a metal hydroxide each using a metal species exclusive of chromium.

(2) The precoated metal sheet as described in (1), wherein the average film thickness of the coat layer is 5 µm or less and the film thickness of the organic resin layer is 1 µm or more.

(3) The precoated metal sheet as described in (1), which comprises, on both surfaces of the metal or plated metal sheet mainly comprising zinc and aluminum, a coat layer having an average film thickness of 5 µm or less and mainly comprising one or both of a metal oxide and a metal hydroxide each using a metal species exclusive of chromium and, on at least one surface, an organic resin layer of 1 µm or more as an upper layer.

(4) The precoated metal sheet as described in any one of (1) to (3), wherein the coverage of the coat layer is from 50% to less than 100%.

(5) The precoated metal sheet as described in any one of (1) to (4), wherein the coat layer is deposited like islands.

(6) The precoated metal sheet as described in any one of (1) to (5), wherein cracks are present in the thickness direction of the coat layer.

(7) The precoated metal sheet as described in any one of (1) to (6), wherein the metal species of one or both of the metal oxide and the metal hydroxide is one or more member selected from zirconium, titanium and silicon.

(8) The precoated metal sheet as described in any one of (1) to (7), wherein the metal species of one or both of the metal oxide and the metal hydroxide is titanium.

According to the present invention, a precoated metal sheet excellent in the coating material adhesion and having little affect on environment can be provided without using a chromate treatment with a chromate containing hexavalent chromium.

BEST MODE FOR CARRYING OUT THE INVENTION

The present invention will now be described in detail.

The metal or plated metal sheet mainly comprising zinc and aluminum for use in the present invention has, on at least one surface thereof, one or both of a metal oxide and a metal hydroxide each using a metal species exclusive of chromium.

As a result of extensive studies, the present inventors have found that when a coat layer mainly comprising one or both of a metal oxide and a metal hydroxide is present on the surface of a metal or plated metal sheet mainly comprising zinc and aluminum, the coating material adhesion is enhanced as compared with the case of not applying such a treatment at all. The mechanism thereof is not clearly known, but it is considered that this is because the metal oxide or metal hydroxide forms strong chemical bonding with an organic resin coated thereon and this brings about enhancement of the coating material adhesion.

The average thickness of the cover layer mainly comprising one or both of a metal oxide and a metal hydroxide is preferably 5 µm or less. If the average thickness exceeds 5 µm, the coating material adhesion is saturated and this is not profitable or, depending on the case, the performance may decrease. As for the lower limit of the average thickness, even if some portions are not covered, it may suffice if the covered portion is covered with at least a monomolecular layer.

The thickness of the organic resin layer stacked on the coat layer is preferably 1 μm or more. If the thickness is less than 1 μm, the coverage is sometimes insufficient. The upper limit is not particularly limited, but if the thickness exceeds 1 cm, the organic resin layer may fail in exhibiting a satisfactory function or the like.

Also, a coat layer mainly comprising one or both of a metal oxide and a metal hydroxide may be provided on both surfaces of a metal or plated metal sheet mainly comprising zinc and aluminum and then an organic resin layer may be stacked on at least one surface. The coat construction may be appropriately selected according to the purpose.

Furthermore, it has been found that when the coverage of the coat layer mainly comprising one or both of a metal oxide and a metal hydroxide is from 50 to less than 100%, the coating material adhesion is more enhanced and is equal to or greater than that of the chromate treatment. The mechanism thereof is also not clearly known, but an activity analogous to so-called anchor effect is considered to bring about enhancement of the coating material adhesion. The coverage as used herein means a ratio of the cover layer area to the surface area of the metal or plated metal sheet mainly comprising zinc and aluminum. Examples of the objective state include a case where the coat layer is deposited like islands as often seen at the treatment with a low amount of film material, a case where a crack reaching the substrate is present in the coat despite a sufficiently large amount of film material, and a case where cracks are present in the island-like deposition part. If the coverage is less than 50%, the effect by the chemical bonding is insufficient.

The metal species of the metal oxide or metal hydroxide formed on the metal sheet of the present invention is not particularly limited, but examples thereof include iron, magnesium, niobium, tantalum, aluminum, nickel, cobalt, titanium, zirconium and silicon. This cover layer may be constituted by one metal species or may be a composite, mixture or laminate of two or more metal species. Among these metals, preferred are titanium, zirconium and silicon. It is believed that this is because the oxide or hydroxide of titanium, zirconium or silicon forms good bonding with an organic material. In particular, titanium is considered to form the best bonding.

The method of forming one or both of a metal oxide and a metal hydroxide on the metal sheet is not particularly limited and a commonly known method can be used. Examples thereof include a liquid phase method such as a liquid phase deposition process using a fluoride ion, e.g., fluoro-complex ion of metal, or a sol-gel process, and a dry method such as sputtering or CVD.

The method for controlling the coverage of the metal oxide or metal hydroxide formed on the metal sheet surface or forming cracks is not particularly limited, but examples thereof may include, for example, mechanical grinding with abrasive paper or the like, heat shock such as quenching, and chemical etching with an acidic aqueous solution, an alkaline aqueous solution or a fluoride ion-containing aqueous solution. Of course, cracks may be naturally generated depending on the film formation method or film formation conditions.

Examples of the metal or plated metal sheet which can be used in the present invention is not particularly limited as long as it mainly comprises zinc and aluminum, but examples thereof include JIS 7000 series (Al—Zn type), Zn—Al alloy-plated steel sheet, Zn—Al—Mg alloy-plated steel sheet, Zn—Al—Mg—Si alloy-plated steel sheet and Al—Zn—Si alloy-plated steel sheet.

The coating material for forming the organic resin layer of the precoated metal sheet of the present invention is not particularly limited and a coating material usually used for precoated metal sheets can be used as-is. As for the resin, commonly known resins may be used according to usage. More specifically, examples thereof include those where a resin component such as high molecular polyester-based resin, polyester-based resin, acryl-based resin, epoxy-based resin, urethane-based resin, fluorine-based resin, silicon polyester-based resin, vinyl chloride-based resin, polyolefin-based resin, butyral-based resin, polycarbonate-based resin, phenol-based resin or a modified resin thereof is crosslinked by a crosslinking agent component such as butylated melamine, methylated melamine, butyl methyl-mixed melamine, urea resin, isocyanate or a mixture thereof, and also include electron beam-curable resins and ultraviolet-curable resins. The coating material for the precoated metal sheet of the present invention may contain a coloring pigment or dye or a gloss-adjusting agent such as silica and also, if desired, may contain a surface smoothing agent, an ultraviolet absorbent, a hindered amine-based photostabilizer, a viscosity adjusting agent, a curing catalyst, a pigment dispersant, a pigment precipitation inhibitor, a color separation inhibitor and the like. Of course, the coating may comprise two or more layers. The undercoat coating may contain a rust-preventive pigment. For the rust-preventive pigment, known rust-preventive pigments can be used and examples of the rust-preventive pigment which can be used include phosphoric acid-based rust-preventive pigments such as zinc phosphate, iron phosphate, aluminum phosphate and zinc phosphite, molybdic acid-based rust-preventive pigments such as calcium molybdate, aluminum molybdate and barium molybdate, vanadium-based rust-preventive pigments such as vanadium oxide, silicate-based pigments such as calcium silicate, chromate-based rust-preventive pigments such as strontium chromate, zinc chromate, calcium chromate, potassium chromate and barium chromate, fine particulate silicas such as water-dispersed silica and fumed silica, and ferroalloys such as ferrosilicon. These may be used individually or as a mixture of multiple species. Furthermore, a carbon black powder or the like may also be added. However, in order to reduce the affect on environment, use of a chromate-based rust-preventive pigment is preferably avoided.

EXAMPLES

The present invention will now be described in greater detail below by referring to Examples, but the present invention is not limited to these Examples.

The metal sheets used were a hot-dip 55% Al-43.4% Zn-1.6% Si alloy-plated steel sheet (plating coverage on both surfaces: 150 g/m$^2$), a Zn-11% Al-3% Mg-0.2% Si alloy-plated steel sheet (plating coverage on both surfaces: 120 g/m$^2$) and an aluminum alloy sheet (7001 (Al—Zn—Mg type)). These metal sheets all had a thickness of 0.8 mm. Each metal sheet sample was subjected to an alkali degreasing treatment (with "SURFCLEANER 155", produced by Nippon Paint Co., Ltd.) and then to the tests.

For imparting a metal oxide or a metal hydroxide to the metal sheet, a liquid phase deposition process or a sputtering process was used.

The treating solutions used in the liquid phase deposition process were the following aqueous hexafluoro-complex salt solutions which were adjusted, mainly using ammonium fluoride and if desired, further using hydrofluoric acid or aqueous ammonia, such that the molar ratio of metal and entire fluorine was about 1:7 and the pH was about 3. That is, these were an aqueous 0.1 mol/L ammonium hexafluorosilicate solution, an aqueous 0.1 mol/L ammonium hexafluorotitanate solution, an aqueous 0.1 mol/L ammonium hexafluorozirconate solution, a mixed aqueous solution of an aqueous 0.05 mol/L ammonium hexafluorotitanate solution and an aqueous 0.05 mol/L ammonium hexafluorosilicate solution (Mixed Solution A), a mixed aqueous solution of an aqueous 0.05 mol/L ammonium hexafluorotitanate solution and an aqueous 0.05 mol/L ammonium hexafluorozirconate solution (Mixed Solution B), a mixed aqueous solution of an aqueous 0.05 mol/L ammonium hexafluorozirconate solution and an aqueous 0.05 mol/L ammonium hexafluorosilicate solution (Mixed Solution C), and a mixed aqueous solution of an aqueous 0.03 mol/L ammonium hexafluorotitanate solution, an aqueous 0.03 mol/L ammonium hexafluorosilicate solution and an aqueous 0.03 mol/L ammonium hexafluorozirconate solution (Mixed Solution D). Each metal sheet after degreasing was dipped in the treating solution and treated under the following conditions to form a film of metal oxide or metal hydroxide.

(a) Film Formation of Metal Oxide or Metal Hydroxide by Simple Dipping

The film formation was performed at room temperature for 1 to 10 minutes and after the film formation, the metal sheet was washed with water and dried.

(b) Film Formation of Metal Oxide or Metal Hydroxide by Cathodic Electrolysis Using Platinum as the Counter Electrode The film formation was performed at room temperature for 1 to 10 minutes by controlling the current density to 100 mA/cm² and, after the film formation, the metal sheet was washed with water and dried.

In the sputtering process, a film of a metal oxide was formed on the substrate metal sheet by using Si, Ti or Zr as a target.

Each film formed by the liquid phase process or sputtering process was subjected to analyses by X-ray photoelectric spectroscopy and infrared ray spectroscopy to confirm the production of metal oxide or metal hydroxide. Also, the coverage of the film formed was determined as follows. The film was observed through a scanning electron microscope at a magnification of 10,000 times and after distinguishing the substrate metal and the film by image processing, the ratio of the film was determined. This operation was performed at 5 locations and the average thereof was used as the coverage.

For the purpose of comparison, a coating-type chromate treating agent (resin-containing type) was coated to a metal sheet to give a chromate coverage of 20 mg/m² and then dried.

On each of the metal sheet having formed thereon a metal oxide or metal hydroxide film, the chromate-treated metal sheet and the untreated metal sheet, a high molecular polyester-based coating material (NSC200HQ, produced by Nippon Fine Coatings K.K.) was coated to give a dry film thickness of 15 µm, thereby producing precoated metal sheets.

These precoated metal sheets were evaluated regarding coating material adhesion under the following conditions.

The precoated metal sheet produced by the above-described method was dipped in boiling water for 60 minutes. Thereafter, crosscuts were formed thereon according to the crosscut test method described in JIS K 5400 and further an Erichsen process yielding an Erichsen value of 7 mm was applied. A pressure-sensitive adhesive tape (cellophane tape produced by Nichiban Co., Ltd.) was laminated on the worked part and then swiftly peeled off by pulling it toward the oblique direction of 45°, and the number of peeled crosscuts out of 100 crosscuts was counted. The adhesion was evaluated on a 7-stage scale according to the degree of peeling. The scores of the coating material adhesion are as follows.

Score
7: No peeling.
6: The peeled area ratio was less than 5%.
5: The peeled area ratio was from 5% to less than 10%.
4: The peeled area ratio was from 10% to less than 20%.
3: The peeled area ratio was from 20% to less than 50%.
2: The peeled area ratio was from 50% to less than 70%.
1: The peeled area ratio was 70% or more.

The results obtained are shown in Tables 1 to 3.

TABLE 1

Examples of substrate metal sheets of 55% Al—43.4% Zn—1.6% Si alloy-plated steel sheet

| No. | Treating Solution (liquid phase process) or Target (sputtering process) | Treating Method | Coverage, % | State of Coat | Film Thickness, µm | Adhesion | Remarks |
|---|---|---|---|---|---|---|---|
| 1 | ammonium hexafluorosilicate | simple dipping | 100 | — | 5 | 5 | Invention |
| 2 | ammonium hexafluorosilicate | cathodic electrolysis | 100 | — | 5 | 5 | Invention |
| 3 | ammonium hexafluorotitanate | simple dipping | 40 | island-like | 3 | 3 | Invention |
| 4 | ammonium hexafluorotitanate | simple dipping | 50 | island-like | 3.3 | 6 | Invention |
| 5 | ammonium hexafluorotitanate | simple dipping | 60 | island-like, cracks | 3.6 | 6 | Invention |
| 6 | ammonium hexafluorotitanate | simple dipping | 70 | island-like, cracks | 4 | 6 | Invention |
| 7 | ammonium hexafluorotitanate | simple dipping | 80 | cracks | 4.3 | 6 | Invention |
| 8 | ammonium hexafluorotitanate | simple dipping | 90 | cracks | 4.6 | 6 | Invention |
| 9 | ammonium hexafluorotitanate | simple dipping | 100 | — | 5 | 5 | Invention |
| 10 | ammonium hexafluorotitanate | cathodic electrolysis | 100 | — | 5 | 5 | Invention |
| 11 | ammonium hexafluorozirconate | simple dipping | 100 | — | 5 | 5 | Invention |
| 12 | ammonium hexafluorozirconate | cathodic electrolysis | 100 | — | 5 | 5 | Invention |
| 13 | Mixed Solution A | simple dipping | 100 | — | 5 | 5 | Invention |
| 14 | Mixed Solution A | cathodic electrolysis | 40 | island-like | 3 | 3 | Invention |
| 15 | Mixed Solution A | cathodic electrolysis | 50 | island-like | 3.3 | 5 | Invention |
| 16 | Mixed Solution A | cathodic electrolysis | 60 | island-like, cracks | 3.6 | 5 | Invention |
| 17 | Mixed Solution A | cathodic electrolysis | 70 | island-like, cracks | 4 | 6 | Invention |
| 18 | Mixed Solution A | cathodic electrolysis | 80 | cracks | 4.3 | 6 | Invention |
| 19 | Mixed Solution A | cathodic electrolysis | 90 | cracks | 4.6 | 5 | Invention |
| 20 | Mixed Solution A | cathodic electrolysis | 100 | — | 5 | 5 | Invention |

TABLE 1-continued

Examples of substrate metal sheets of 55% Al—43.4% Zn—1.6% Si alloy-plated steel sheet

| No. | Treating Solution (liquid phase process) or Target (sputtering process) | Treating Method | Coverage, % | State of Coat | Film Thickness, μm | Adhesion | Remarks |
|---|---|---|---|---|---|---|---|
| 21 | Mixed Solution B | simple dipping | 100 | — | 5 | 5 | Invention |
| 22 | Mixed Solution B | cathodic electrolysis | 100 | — | 5 | 5 | Invention |
| 23 | Mixed Solution C | simple dipping | 100 | — | 5 | 5 | Invention |
| 24 | Mixed Solution C | cathodic electrolysis | 100 | — | 5 | 5 | Invention |
| 25 | Mixed Solution D | simple dipping | 100 | — | 5 | 5 | Invention |
| 26 | Mixed Solution D | cathodic electrolysis | 100 | — | 5 | 5 | Invention |
| 27 | Si | sputtering→polishing[1] | 80 | cracks | 4.3 | 6 | Invention |
| 28 | Si | sputtering | 100 | — | 5 | 5 | Invention |
| 29 | Ti | sputtering→polishing[1] | 80 | cracks | 4.3 | 6 | Invention |
| 30 | Ti | sputtering | 100 | — | 5 | 5 | Invention |
| 31 | Zr | sputtering→polishing[1] | 80 | cracks | 4.3 | 6 | Invention |
| 32 | Zr | sputtering | 100 | — | 5 | 5 | Invention |
| 33 | chromate treating agent | coating | — | — | — | 5 | Comparative |
| 34 | untreated | — | — | — | — | 1 | Comparative |

[1] The film was formed by sputtering and then polished with a diamond paste.

TABLE 2

Examples of substrate metal sheets of Zn—11% Al—3% Mg—0.2% Si alloy-plated steel sheet

| No. | Treating Solution (liquid phase process) or Target (sputtering process) | Treating Method | Coverage, % | State of Coat | Film Thickness, μm | Adhesion | Remarks |
|---|---|---|---|---|---|---|---|
| 35 | ammonium hexafluorosilicate | simple dipping | 100 | — | 5 | 5 | Invention |
| 36 | ammonium hexafluorosilicate | cathodic electrolysis | 100 | — | 5 | 5 | Invention |
| 37 | ammonium hexafluorotitanate | simple dipping | 40 | island-like | 3 | 3 | Invention |
| 38 | ammonium hexafluorotitanate | simple dipping | 50 | island-like | 3.3 | 6 | Invention |
| 39 | ammonium hexafluorotitanate | simple dipping | 60 | island-like, cracks | 3.6 | 6 | Invention |
| 40 | ammonium hexafluorotitanate | simple dipping | 70 | island-like, cracks | 4 | 6 | Invention |
| 41 | ammonium hexafluorotitanate | simple dipping | 80 | cracks | 4.3 | 6 | Invention |
| 42 | ammonium hexafluorotitanate | simple dipping | 90 | cracks | 4.6 | 6 | Invention |
| 43 | ammonium hexafluorotitanate | simple dipping | 100 | — | 5 | 5 | Invention |
| 44 | ammonium hexafluorotitanate | cathodic electrolysis | 100 | — | 5 | 5 | Invention |
| 45 | ammonium hexafluorozirconate | simple dipping | 100 | — | 5 | 5 | Invention |
| 46 | ammonium hexafluorozirconate | cathodic electrolysis | 100 | — | 5 | 5 | Invention |
| 47 | Mixed Solution A | simple dipping | 100 | — | 5 | 5 | Invention |
| 48 | Mixed Solution A | cathodic electrolysis | 40 | island-like | 3 | 3 | Invention |
| 49 | Mixed Solution A | cathodic electrolysis | 50 | island-like | 3.3 | 5 | Invention |
| 50 | Mixed Solution A | cathodic electrolysis | 60 | island-like, cracks | 3.6 | 5 | Invention |
| 51 | Mixed Solution A | cathodic electrolysis | 70 | island-like, cracks | 4 | 6 | Invention |
| 52 | Mixed Solution A | cathodic electrolysis | 80 | cracks | 4.3 | 6 | Invention |
| 53 | Mixed Solution A | cathodic electrolysis | 90 | cracks | 4.6 | 5 | Invention |
| 54 | Mixed Solution A | cathodic electrolysis | 100 | — | 5 | 5 | Invention |
| 55 | Mixed Solution B | simple dipping | 100 | — | 5 | 5 | Invention |
| 56 | Mixed Solution B | cathodic electrolysis | 100 | — | 5 | 5 | Invention |
| 57 | Mixed Solution C | simple dipping | 100 | — | 5 | 5 | Invention |
| 58 | Mixed Solution C | cathodic electrolysis | 100 | — | 5 | 5 | Invention |
| 59 | Mixed Solution D | simple dipping | 100 | — | 5 | 5 | Invention |
| 60 | Mixed Solution D | cathodic electrolysis | 100 | — | 5 | 5 | Invention |
| 61 | Si | sputtering→polishing[1] | 80 | cracks | 4.3 | 6 | Invention |
| 62 | Si | sputtering | 100 | — | 5 | 5 | Invention |
| 63 | Ti | sputtering→polishing[1] | 80 | cracks | 4.3 | 6 | Invention |
| 64 | Ti | sputtering | 100 | — | 5 | 5 | Invention |
| 65 | Zr | sputtering→polishing[1] | 80 | cracks | 4.3 | 6 | Invention |
| 66 | Zr | sputtering | 100 | — | 5 | 5 | Invention |
| 67 | chromate treating agent | coating | — | — | — | 5 | Comparative |
| 68 | untreated | — | — | — | — | 1 | Comparative |

[1] The film was formed by sputtering and then polished with a diamond paste.

TABLE 3

Examples of substrate metal sheets of aluminum alloy (7001 (Al—Zn—Mg))

| No. | Treating Solution (liquid phase process) or Target (sputtering process) | Treating Method | Coverage, % | State of Coat | Film Thickness, μm | Adhesion | Remarks |
|---|---|---|---|---|---|---|---|
| 69 | ammonium hexafluorosilicate | simple dipping | 100 | — | 5 | 5 | Invention |
| 70 | ammonium hexafluorosilicate | cathodic electrolysis | 100 | — | 5 | 5 | Invention |
| 71 | ammonium hexafluorotitanate | simple dipping | 40 | island-like | 3 | 3 | Invention |
| 72 | ammonium hexafluorotitanate | simple dipping | 50 | island-like | 3.3 | 6 | Invention |
| 73 | ammonium hexafluorotitanate | simple dipping | 60 | island-like, cracks | 3.6 | 6 | Invention |
| 74 | ammonium hexafluorotitanate | simple dipping | 70 | island-like, cracks | 4 | 6 | Invention |
| 75 | ammonium hexafluorotitanate | simple dipping | 80 | cracks | 4.3 | 6 | Invention |
| 76 | ammonium hexafluorotitanate | simple dipping | 90 | cracks | 4.6 | 6 | Invention |
| 77 | ammonium hexafluorotitanate | simple dipping | 100 | — | 5 | 5 | Invention |
| 78 | ammonium hexafluorotitanate | cathodic electrolysis | 100 | — | 5 | 5 | Invention |
| 79 | ammonium hexafluorozirconate | simple dipping | 100 | — | 5 | 5 | Invention |
| 80 | ammonium hexafluorozirconate | cathodic electrolysis | 100 | — | 5 | 5 | Invention |
| 81 | Mixed Solution A | simple dipping | 100 | — | 5 | 5 | Invention |
| 82 | Mixed Solution A | cathodic electrolysis | 40 | island-like | 3 | 3 | Invention |
| 83 | Mixed Solution A | cathodic electrolysis | 50 | island-like | 3.3 | 5 | Invention |
| 84 | Mixed Solution A | cathodic electrolysis | 60 | island-like, cracks | 3.6 | 5 | Invention |
| 85 | Mixed Solution A | cathodic electrolysis | 70 | island-like, cracks | 4 | 6 | Invention |
| 86 | Mixed Solution A | cathodic electrolysis | 80 | cracks | 4.3 | 6 | Invention |
| 87 | Mixed Solution A | cathodic electrolysis | 90 | cracks | 4.6 | 5 | Invention |
| 88 | Mixed Solution A | cathodic electrolysis | 100 | — | 5 | 5 | Invention |
| 89 | Mixed Solution B | simple dipping | 100 | — | 5 | 5 | Invention |
| 90 | Mixed Solution B | cathodic electrolysis | 100 | — | 5 | 5 | Invention |
| 91 | Mixed Solution C | simple dipping | 100 | — | 5 | 5 | Invention |
| 92 | Mixed Solution C | cathodic electrolysis | 100 | — | 5 | 5 | Invention |
| 93 | Mixed Solution D | simple dipping | 100 | — | 5 | 5 | Invention |
| 94 | Mixed Solution D | cathodic electrolysis | 100 | — | 5 | 5 | Invention |
| 95 | Si | sputtering→polishing[1] | 80 | cracks | 4.3 | 6 | Invention |
| 96 | Si | sputtering | 100 | — | 5 | 5 | Invention |
| 97 | Ti | sputtering→polishing[1] | 80 | cracks | 4.3 | 6 | Invention |
| 98 | Ti | sputtering | 100 | — | 5 | 5 | Invention |
| 99 | Zr | sputtering→polishing[1] | 80 | cracks | 4.3 | 6 | Invention |
| 100 | Zr | sputtering | 100 | — | 5 | 5 | Invention |
| 101 | chromate treating agent | coating | — | — | — | 5 | Comparative |
| 102 | untreated | — | — | — | — | 1 | Comparative |

[1] The film was formed by sputtering and then polished with a diamond paste.

In all cases, the precoated metal sheet of the present invention exhibits excellent adhesion as compared with untreated metal sheet and is verified to have an adhesion performance comparable to that of the chromate-treated sheet. Furthermore, the precoated metal sheet of the present invention contains no hexavalent chromium and, accordingly, apparently has little affect on environment as compared with the chromate treated sheet.

The invention claimed is:

1. A precoated metal sheet comprising a metal or plated metal sheet having stacked, on at least one surface thereof, at least a coat layer and an organic resin layer, the plating of the plated metal sheet consisting essentially of zinc and aluminum and the coat layer consisting of one or both of a metal oxide and a metal hydroxide, wherein said one or both of the metal oxide and the metal hydroxide do not contain chromium, and wherein the coverage of said coat layer is from 50% to 90%.

2. The precoated metal sheet as claimed in claim 1, wherein the average film thickness of said coat layer is 5 μm or less and the film thickness of said organic resin layer is 1 μm or more.

3. The precoated metal sheet as claimed in claim 1, which comprises, on both surfaces of the metal or plated metal sheet, said coat layer having an average film thickness of 5 μm or less and, on at least one surface, an organic resin layer of 1 μm or more as an upper layer.

4. The precoated metal sheet as claimed in claim 1, wherein said coat layer is in a form of islands.

5. The precoated metal sheet as claimed in claim 1, wherein cracks are present in the thickness direction of said coat layer.

6. The precoated metal sheet as claimed in claim 1, wherein the metal species of one or both of said metal oxide and metal hydroxide is one or more member selected from the group consisting of zirconium, titanium and silicon.

7. The precoated metal sheet as claimed claim 1, wherein the metal species of one or both of said metal oxide and metal hydroxide is titanium.

* * * * *